United States Patent [19]
Fujii

[11] Patent Number: 5,327,450
[45] Date of Patent: Jul. 5, 1994

[54] OPTICAL SEMICONDUCTOR DEVICE AND PROCESS OF PRODCUING SAME

[75] Inventor: Takuya Fujii, Kawasaki, Japan
[73] Assignee: Fujitsu Limited, Kawasaki, Japan
[21] Appl. No.: 937,122
[22] Filed: Aug. 31, 1992
[30] Foreign Application Priority Data
  Sep. 5, 1991 [JP] Japan ................... 3-226125
[51] Int. Cl.$^5$ .......................... H01S 3/08; H01S 3/19
[52] U.S. Cl. ....................... 372/96; 372/45; 372/46; 372/48
[58] Field of Search ..................... 372/96, 45, 46, 48
[56] References Cited

U.S. PATENT DOCUMENTS

| | | | |
|---|---|---|---|
| 4,665,528 | 5/1987 | Chinone et al. | 372/96 |
| 4,740,987 | 4/1988 | McCall, Jr. et al. | 372/96 |

FOREIGN PATENT DOCUMENTS

| | | | |
|---|---|---|---|
| 0213190 | 12/1984 | Japan | 372/96 |
| 0102788 | 6/1985 | Japan | 372/96 |
| 0156386 | 6/1988 | Japan | 372/96 |

OTHER PUBLICATIONS

T. Fujii et al., "MOVPE growth of wire-shaped InGaAs corrugated InP," Inst. Phys. Conf. Ser. No. 120: Chapter 11, *Int. Symp. GaAs and Related Compounds*, Seattle, Wash., pp. 541-546, 1991. (no month for publication).

*Primary Examiner*—Georgia Y. Epps
*Attorney, Agent, or Firm*—Staas & Halsey

[57] ABSTRACT

An optical semiconductor device and a process of producing same ensuring a good device performance when a diffraction grating is formed by dry etching and component crystal layers are formed by an MOCVD process. The production process comprises the steps of: (1) processing a surface of a semiconductor wafer to form thereon a diffraction grating in the form of a periodic corrugation for selectively transmitting a light having a specific wavelength; (2) forming on the diffraction grating a guide layer, an active layer and a clad layer in that order; (3) forming on the clad layer a double heterostructure composed of lower and upper layers, the upper layer having a bandgap greater than that of the active layer; (4) measuring the photoluminescence intensity of the lower layer of the double heterostructure; and (5) determining whether or not subsequent process steps necessary for completing the optical semiconductor device should be executed, by using the measured value of the photoluminescence intensity as a discriminative value.

8 Claims, 5 Drawing Sheets

OPTICAL SEMICONDUCTOR DEVICE AND PROCESS OF PRODCUING SAME

BACKGROUND OF THE INVENTION

1. Field of the Invention

The present invention relates to an optical semiconductor device and a process of producing same.

To provide a very high speed optical communication system, an advanced optical semiconductor device has a diffraction grating formed therein for transmitting a light having a specific wavelength. Typical applications of such diffraction grating include a distributed feedback laser (DFB-LD).

2. Description of the Related Art

In the latest trend of producing these diffraction gratings, a dry etching process is often used to control the grating or corrugation height more precisely than the old wet etching process. Component crystals of an optical semiconductor device are also often formed by metalorganic chemical vapor deposition (MOCVD) to control the crystal composition and the crystal layer thickness more precisely than the old liquid phase crystal growth process.

To form a diffraction grating on an InP wafer or substrate, the surface of the InP crystal substrate is processed by dry etching such as reactive ion etching (RIE) using an ethane gas plasma to form a periodic corrugation having a height corresponding to that of the desired diffraction grating.

In the conventional process of producing an optical semiconductor device, a diffraction grating is formed with a corrugation height of about 40 nm, i e., the height applied when component crystal layers of the device are formed by a liquid phase growth process, and then component crystal layers are actually formed on the diffraction grating by MOCVD.

Generally, component crystal layers of an optical semiconductor device are formed by a three-stage crystal growth process: the first stage of growing crystal layers including an active layer to form a laminate structure on a diffraction grating or a periodic corrugation, followed by etching the laminate structure to form a mesa structure; the second stage of growing crystal layers filling both sides of the mesa structure; and the third stage of growing thereon crystal layers including an uppermost contact layer. Upper and lower electrodes are then formed to complete an optical semiconductor device.

Regarding the production of a distributed feedback laser (DFB-LD), FIG. 1 exemplifies crystal layers formed on an n-InP crystal substrate in the above-mentioned first growth stage. After forming a diffraction grating 2 in the form of a periodic corrugation on an n-InP substrate 1 by dry-etching the substrate surface, an MOCVD process is carried out to form, on the diffraction grating 2, an n-InGaAsP guide layer 3 with a composition providing a luminescence wavelength of 1.1 $\mu$m, an InGaAsP active layer 4 with a composition providing a luminescence wavelength of 1.55 $\mu$m, and a p-InP clad layer 5 in that order.

As shown in FIG. 2, a distributed feedback laser is produced by etching the laminate structure (from the substrate 1 through to the clad layer 5), which has been formed in the first growth stage, to form a mesa structure "M" extending perpendicular to the direction of the periodic corrugation, then forming a p-InP layer 8 and an n-InP layer 9 to fill both sides of the mesa "M", and forming thereon a p-InP layer 10, an InGaAsP contact layer 11 and upper and lower electrodes 12 and 13. Typically, the mesa "M" has a width of about 1.3 $\mu$m and the cavity length is 900 $\mu$m.

The inventors, however, found that a distributed feedback laser produced by the above-mentioned conventional process exhibits a poor performance including the lasing threshold current density and the luminescence efficiency in comparison with that of a device produced by a process in which wet etching is used to form a diffraction grating and a liquid phase crystal growth process is used to form component crystal layers of the device.

SUMMARY OF THE INVENTION

The object of the present invention is to provide an optical semiconductor device and a process of producing same ensuring a good device performance when a diffraction grating is formed by dry etching and component crystal layers are formed by an MOCVD process.

To achieve the above object according to the present invention, there is provided a process of producing an optical semiconductor device, comprising the steps of:

(1) processing a surface of a semiconductor wafer to form thereon a diffraction grating in the form of a periodic corrugation for selectively transmitting a light having a specific wavelength;

(2) forming on the diffraction grating a guide layer, an active layer and a clad layer in that order;

(3) forming on the clad layer a double heterostructure composed of lower and upper layers, the upper layer having a bandgap greater than that of the active layer;

(4) measuring the photoluminescence intensity of the lower layer of the double heterostructure; and (5) determining whether or not subsequent process steps necessary for completing the optical semiconductor device should be executed, by using the measured value of the photoluminescence intensity as a discriminative value.

Typically, the semiconductor wafer is an InP semiconductor wafer; the active layer is composed of InGaAs, InGaAsP or AlInGaAs; the clad layer is composed of InP, AlInAs, or AlInGaAs; the lower layer is composed of InGaAs or InGaAsP; and the upper layer is composed of InGaAsP or InP.

To achieve the object according to the present invention, there is also provided an optical semiconductor device, comprising:

a semiconductor substrate;

a diffraction grating in the form of a periodic corrugation formed by processing a surface of the semiconductor substrate for selectively transmitting a light having a specific wavelength; and a guide layer, an active layer and a clad layer formed on the diffraction grating in that order, the diffraction grating having a corrugation height determined by the following steps (A) to (D);

(A) preparing a plurality of reference samples having diffraction gratings with different corrugation heights, respectively, by (1) processing surfaces of a plurality of semiconductor wafers or a plurality of surface regions of a single semiconductor wafer; (2) forming on the diffraction gratings a guide layer, an active layer and a clad layer in that order; and (3) forming on the clad layer a double heterostructure composed of lower and upper layers, the upper layer having a bandgap greater than that of the active layer;

(B) measuring the photoluminescence intensity of the lower layers of the double heterostructures of the reference samples;

(C) determining two ranges of the corrugation height in which the photoluminescence intensity takes higher and lower levels of value, respectively, based on an interrelationship between the measured values of the photoluminescence intensity and the corresponding corrugation heights of the diffraction gratings; and (D) electing the corrugation height within the determined range in which the photoluminescence intensity takes the higher level of value.

DESCRIPTION OF THE PREFERRED EMBODIMENTS

The present inventors considered that the device performance is poor when the surface region of an InP substrate is damaged during dry etching for forming a diffraction grating, the damaged region is not recovered before commencement of the crystal growth by MOCVD, and an electric current introduced into the device is nonradioactively recombined in the damaged region and it is found that there is a clear correlation between the dry-etched depth or the corrugation height of a diffraction grating and the crystalline quality of crystal layers formed thereon or the device performance.

The present invention makes use of this correlation to evaluate or predict the performance of a product device in an early stage of a device production process, i.e., in the first crystal growth stage, so that the subsequent process steps are executed when a good device performance is predicted or the subsequent process steps are not executed when the predicted device performance is poor.

Figure 1:
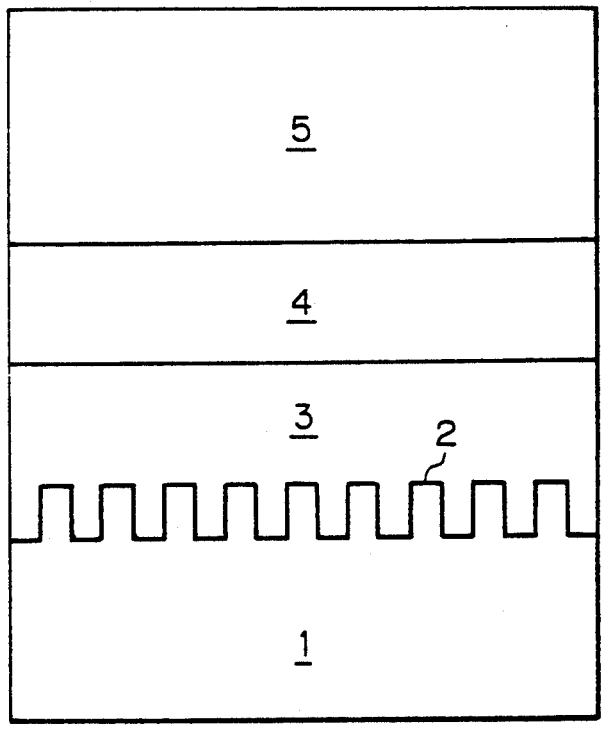
FIG. 1 shows a laminate structure product by the first crystal growth stage of the conventional process, in sectional view.
Figure 3:
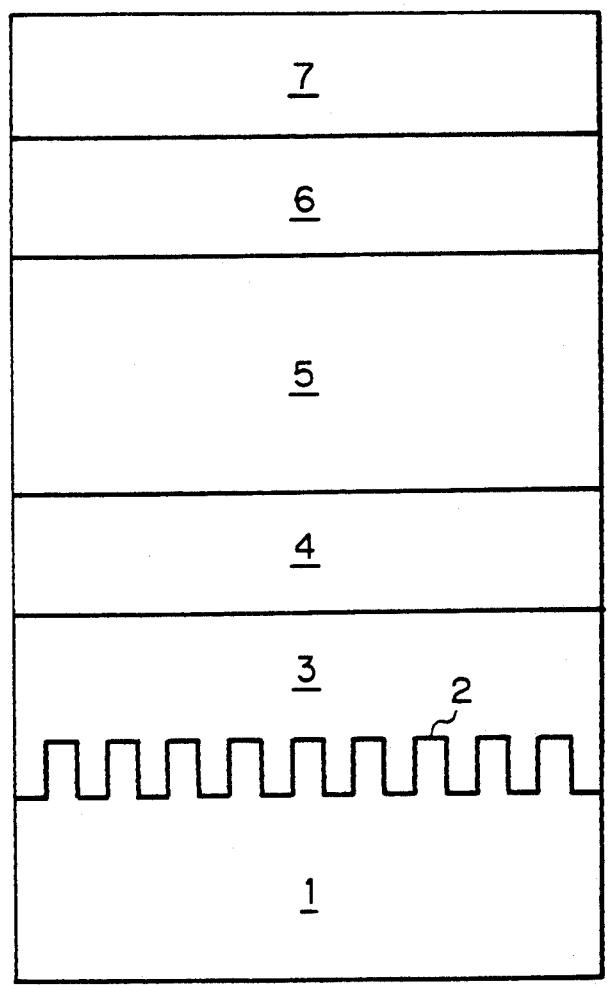
FIG. 3 shows a laminate structure produced by the first crystal growth stage according to the present invention, in sectional view.

FIG. 3 shows a typical structure produced in the first growth stage for the prediction or discrimination according to the present invention, which is composed by forming, on the p-InP clad layer 5 of the first growth structure of FIG. 1, a double heterostructure consisting of a lower layer 6 of InGaAs or InGaAsP and an upper layer 7 of InGaAsP or InP having a bandgap greater than that of the lower layer. The lower layer 6 is used for the crystalline quality evaluation, because it is reasonably expected that the photoluminescence intensity of the layer 6 can be a direct reflection of the crystalline quality of the layer 6 as a carrier diffusion from the n-InP substrate 1 to the crystalline quality evaluating layer 6 does not occur.

Figure 4:
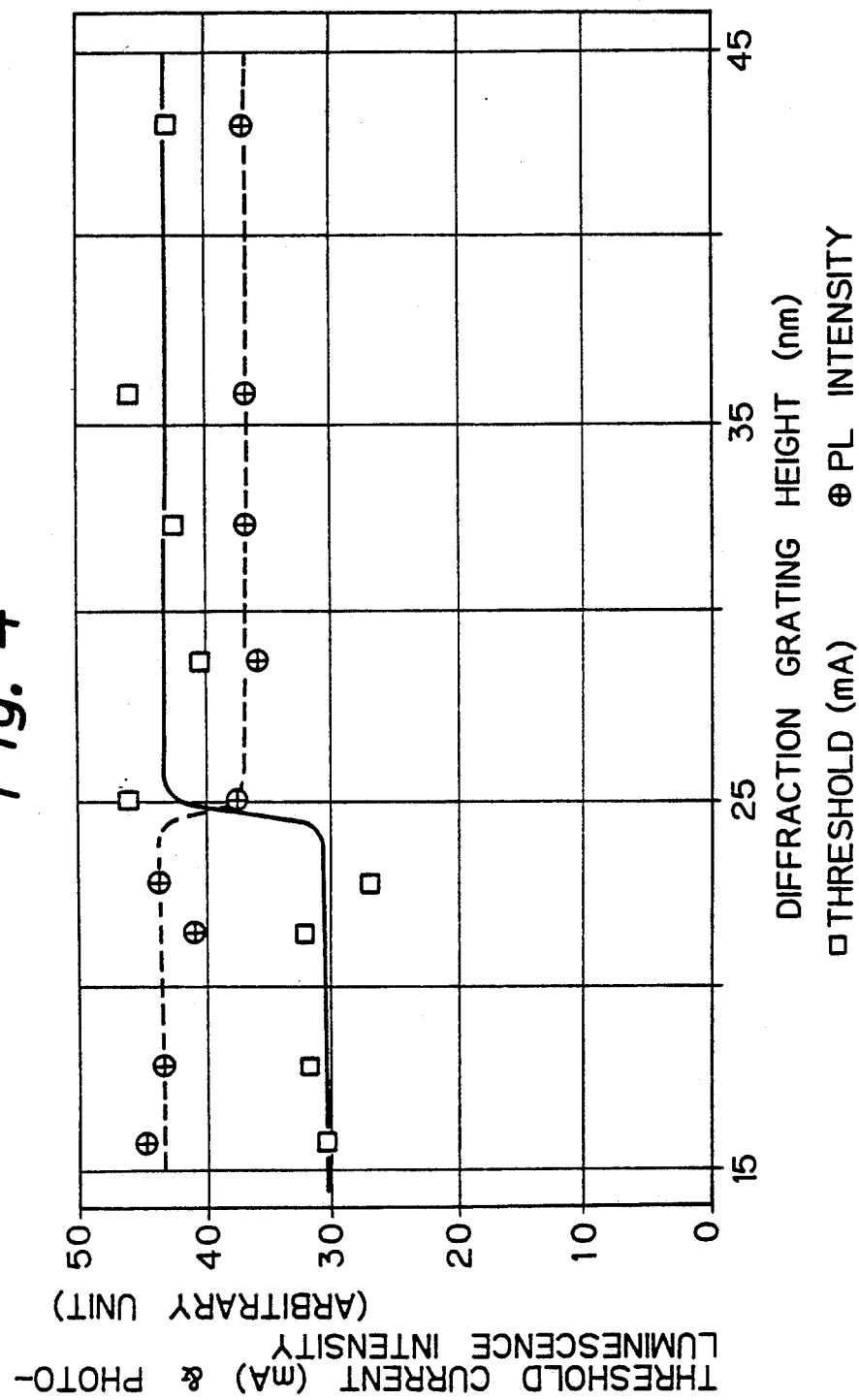
FIG. 4 is a graph showing the photoluminescence intensity of a p-InGaAsP layer for evaluating crystalline quality and the lasing threshold current density of a completed device or a distributed feedback laser as a function of the corrugation height of a diffraction grating.

Regarding the structure shown in FIG. 3, FIG. 4 shows the room temperature photoluminescence intensity of the InGaAsP layer or crystalline quality evaluating layer 6 and the lasing threshold current density of a product device as a function of the corrugation height of a diffraction grating formed by dry etching.

It can be seen from FIG. 4 that both the photoluminescence intensity of the crystalline quality evaluating layer 6 and the lasing threshold of a product device take two distinct levels of values shifting at a diffraction grating height of about 25 nm. Namely, when the diffraction grating height exceeds about 25 nm, the photoluminescence intensity drops to the lower level while the lasing threshold current jumped up to the upper level. When the diffraction grating height is less or more than about 25 nm, the photoluminescence intensity and the lasing threshold are substantially stable on the respective upper or lower levels.

Thus, there is a clear correlation between the photoluminescence intensity of the crystalline quality evaluating layer 6 provided in the first growth structure formed in the first crystal growth stage and the lasing threshold of a completed product device.

This correlation is advantageously used in the present invention to predict the performance of a final product device in the stage in which the first crystal growth is completed. Specifically, in this stage of the semiconductor device production, the photoluminescence intensity of the crystalline quality evaluating layer 6 is measured to effect a screening such that the subsequent process steps are executed only when the measured value satisfies the predetermined reference value. Thus, the subsequent process steps are not carried out in vain when a poor performance is predicted and that only the units in which a good device performance is predicted are subjected to the subsequent process steps.

The unit to be screened or selected is usually a semiconductor wafer on which tens of devices are formed. Although a wafer in which a poor device performance is predicted may occasionally have a portion that could provide a good device performance, the wafer-by-wafer screening still has a great advantage in that the process steps subsequent to the first crystal growth stage requires about 80% of the total processing time for producing a completed product device. Namely, the production of an optical semiconductor device usually involves the process steps of: (s1) forming a diffraction grating, (s2) the first crystal growth, (s3) masking, (s4) mesa etching, (s5) the second crystal growth, (s6) mask removal, (s7) the third crystal growth, (s8) forming electrodes, and (s9) cleavage separation of a wafer to individual devices. The processing time required for effecting the steps (s1) and (s2) amounts only to about 20% of the total processing time for all the process steps (s1) through (s9) whereas that for the steps (s3) through (s9) amounts to about 80%.

According to a preferred embodiment of the present invention, the above-mentioned two levels of photoluminescence intensities are used as the reference values for discrimination. Namely, a process according to the preferred embodiment comprising the steps of:

(A) preparing a plurality of reference samples having diffraction gratings with different corrugation heights, respectively, by performing the same processing as that of said step (1) to form a plurality of diffraction gratings with different corrugation heights on surfaces of a plurality of semiconductor wafers or on a plurality of surface regions of a single semiconductor wafer, respectively, and thereafter, performing the same operations as those of said steps (2) and (3) to form a plurality of said double heterostructures;

(B) measuring the photoluminescence intensity of the lower layers of the double heterostructures of the reference samples;

(C) determining two levels of reference values that the photoluminescence intensity takes in accordance with the corrugation heights of the diffraction gratings, based on an interrelationship between the measured values of the photoluminescence intensity and the corresponding corrugation heights of the diffraction gratings; and (D) determining, in said step (4), that the subsequent steps are executed when said discriminative value corresponds to a higher level of the reference value and is not executed when said discriminative value does not correspond to the higher level of the reference value.

According to a further preferred embodiment of the present invention, a diffraction grating is formed with a corrugation height within a range in which the higher level of the photoluminescence intensity is obtained. Such a process comprises the steps of:

(A) preparing a plurality of reference samples having diffraction gratings with different corrugation heights, respectively, by performing the same processing as that of said step (1) to form a plurality of diffraction gratings with different corrugation heights on surfaces of a plurality of semiconductor wafers or on a plurality of surface regions of a single semiconductor wafer, respectively, and thereafter, performing the same operations as those of said steps (2) and (3) to form a plurality of said double heterostructures;

(B) measuring the photoluminescence intensity of the lower layers of the double heterostructures of the reference samples;

(C) determining two ranges of the corrugation heights in which the photoluminescence intensity takes higher and lower level of values, respectively, based on an interrelationship between the measured values of the photoluminescence intensity and the corresponding corrugation heights of the diffraction gratings; and (D) forming, in said step (1), a diffraction grating having a corrugation height within the determined range in which the photoluminescence intensity takes the higher level of value.

More specifically, a diffraction grating is formed with a corrugation height greater than that corresponding to the transition of the photoluminescence intensity between two levels. In the practical case shown in FIG. 4, because the transition occurs at a corrugation height of about 25 nm, a diffraction grating should be formed with a corrugation height of not more than about 25 nm, i.e., the corrugation height may be 20 nm, for example.

Typically, the semiconductor wafer is an InP semiconductor wafer; the active layer is composed of InGaAs, InGaAsP or AlInGaAs; the clad layer is composed of InP, AlInAs, or AlInGaAs; the lower layer is composed of InGaAs or InGaAsP; and the upper layer is composed of InGaAsP or InP.

According to another preferred embodiment of the present invention, those component layers of said optical semiconductor device that should have a thickness related to the corrugation height of a diffraction grating of said device are formed with a thickness determined in accordance with a corrugation height of the diffraction grating within said determined range. Namely, an optical semiconductor device is designed by first determining the diffraction grating height within the range in which a higher level of the photoluminescence intensity is obtained and then determining the thicknesses of the component crystal layers of the device in accordance with the above-determined diffraction grating height.

One of the most important parameters in designing an optical semiconductor device having a diffraction grating formed therein is the strength of bonding of the diffraction grating with the light leaking from an active layer and passing to the diffraction grating. Accordingly, the bonding strength is first determined, and then the shape of the diffraction grating and the structure of the device are determined.

The conventional process of producing such a device first determines the device structure formed by a crystal growth process, and then selects the diffraction grating height such as to provide a desired bonding between light and the diffraction grating, and optimize the performance of the device.

According to the present invention, designing of an optical semiconductor device is carried out in an inverse sequence, i.e., by first determining the diffraction grating because the diffraction grating height has an upper limit to ensure good device performance.

EXAMPLE

Figure 2:
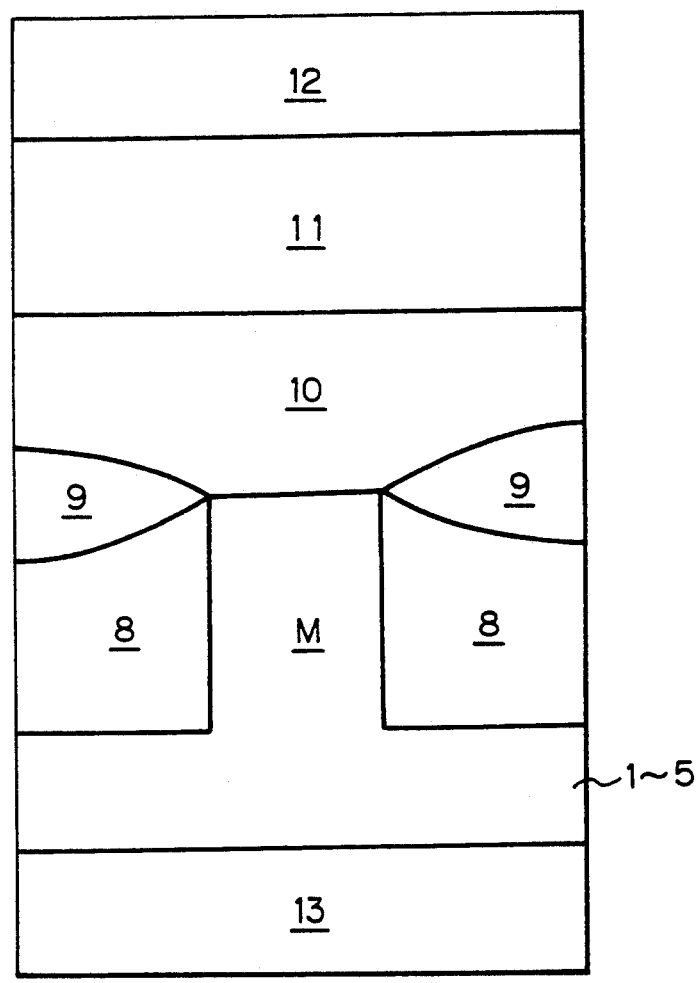
FIG. 2 shows the structure of a distributed feedback laser (DFB-LD), in sectional view.

Referring to FIGS. 2 and 3, a process for producing a distributed feedback laser will be described below.

Referring to FIG. 3, the process sequence of completing a first growth structure will be described.

A photoresist pattern, which is a reverse pattern of a diffraction grating, is formed on an InP substrate 1 by applying a photoresist on the whole surface of the InP substrate, exposing the photoresist by double-beam interference exposure, for example, and then developing the photoresist.

By using the photoresist pattern as a mask, dry etching is effected by reactive ion etching with methane or ethane gas to form a diffraction pattern in the form of a periodic corrugation 2. The dry etching is usually carried out by plasma etching with a reactive gas at room temperature. A typical condition of such an etching includes an ethane gas flow of about 20 sccm and an accelerating voltage of about 100 V.

After completing the dry etching, the photoresist is removed with an organic solvent and the substrate surface is further cleaned with an oxygen plasma to remove a minute amount of residual photoresist from the substrate surface.

The substrate or wafer 1 is then subjected to a sulfuric acid treatment to remove oxides from the surface thereof and placed in the crystal growing chamber of a metalorganic chemical vapor deposition (MOCVD) apparatus for growing the necessary crystal layers. A typical growth condition includes a growth rate of about 1 $\mu$m/hr, a growth temperature of about 600° C., a growth pressure of about 0.1 atm. Typical source materials used for the crystal growth include trimethylindium (In source), triethylgallium (Ga source), arsine (As source) and phosphine (P source).

To compose typical component crystal layers of a distributed feedback laser oscillating at 1.55 $\mu$m, the surface of an n-InP crystal substrate 1 is dry-etched to form a diffraction grating 2 with a corrugation height of about 25 nm, and then an MOCVD process is effected to grow, on the diffraction grating 2, an about 0.1 μm thick n-InGaAsP guide layer 3 with a composition providing a room temperature luminescence wavelength of 1.1 μm, an about 0.1 μm thick InGaAsP active layer 4 with a composition providing a room temperature luminescence wavelength of 1.57 μm, an about 0.4 μm thick p-InP clad layer 5, an about 0.05 μm thick p-InGaAsP cap layer (or crystalline quality evaluating layer) 6 having a composition providing a room temperature luminescence wavelength of 1.3 μm and an about 0.1 μm thick p-InP cap layer 7 in that order. The cap layers 6 and 7 form a double heterostructure. The cavity length is set at about 900 μm.

After completing the above-mentioned first crystal growth stage, the photoluminescence intensity of the p-InGaAsP layer 6 is measured, and only when the measured value satisfies a predetermined reference value, the subsequent process steps are executed as follows.

Referring to FIG. 2, the second and third crystal growth stages will be described.

After removing the p-InGaAsP layers 6 and 7 by selective etching, a mesa structure "M" is formed by etching the lamination from the InP substrate 1 through the p-InP clad layer 5 by using an SiO$_2$ stripe mask (not shown), and then a current blocking layer is grown.

In this second crystal growth stage, a p-InP layer 8 and an n-InP layer 9 are grown to embed the mesa "M". After removing the SiO$_2$ stripe mask, the third crystal growth stage is carried out by growing an about 1 μm thick p-InP clad layer 10 and an about 0.3 μm thick p-InGaAsP contact layer 11 in that order, and finally, electrodes 12 and 13 are formed on the contact layer 11 and the back surface of the substrate 11, respectively, to complete a device structure of a distributed feedback laser oscillating in a single mode of a wavelength of 1.55 μm.

Although, in the above-described example, a double heterostructure (layers 6 and 7) is removed prior to the second crystal growth stage, the double heterostructure may not necessarily be removed so long as it does not adversely affect the device performance. The removal of the double heterostructure may not necessarily be effected prior to the second crystal growth stage but may be effected after the second crystal growth stage and prior to the third crystal growth stage upon removal of the SiO$_2$ mask.

It is surprising finding that the lasing threshold current density of a completed or final product device is better predicted by the photoluminescence intensity of the crystalline quality evaluating layer according to the present invention than the photoluminescence intensity of the active layer, although the reason therefor has not yet been fully clarified.

Figure 5A:
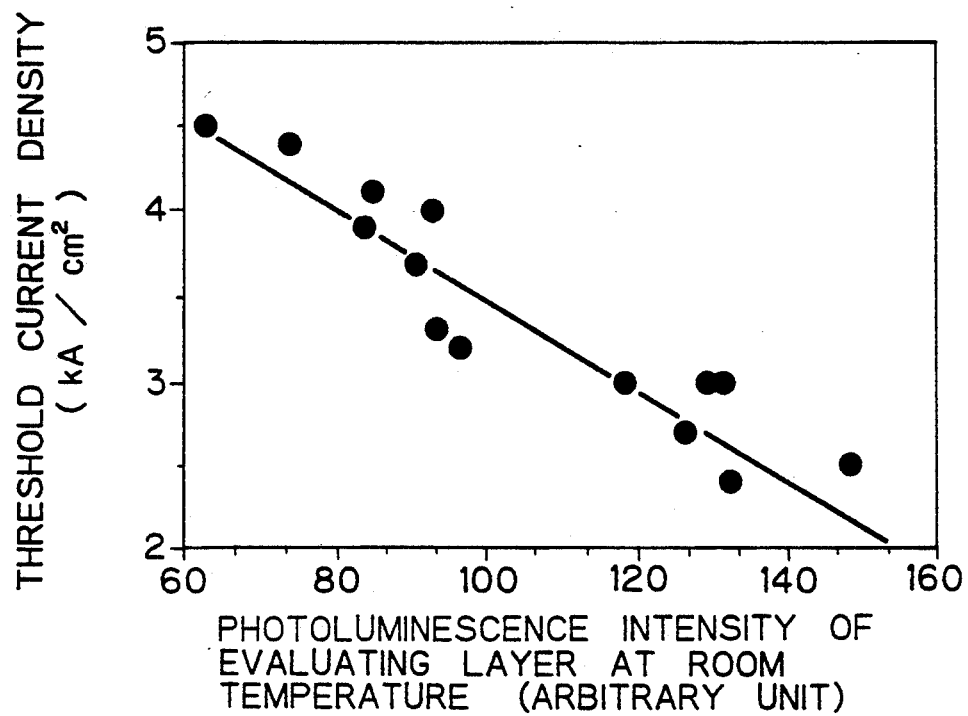
FIGS. 5(A) and 5(B) are graphs showing the lasing threshold current density of a product device as a function of (A) the photoluminescence intensity of a crystalline quality evaluating layer according the present invention and (B) the photoluminescence intensity of an active layer.
Figure 5B:
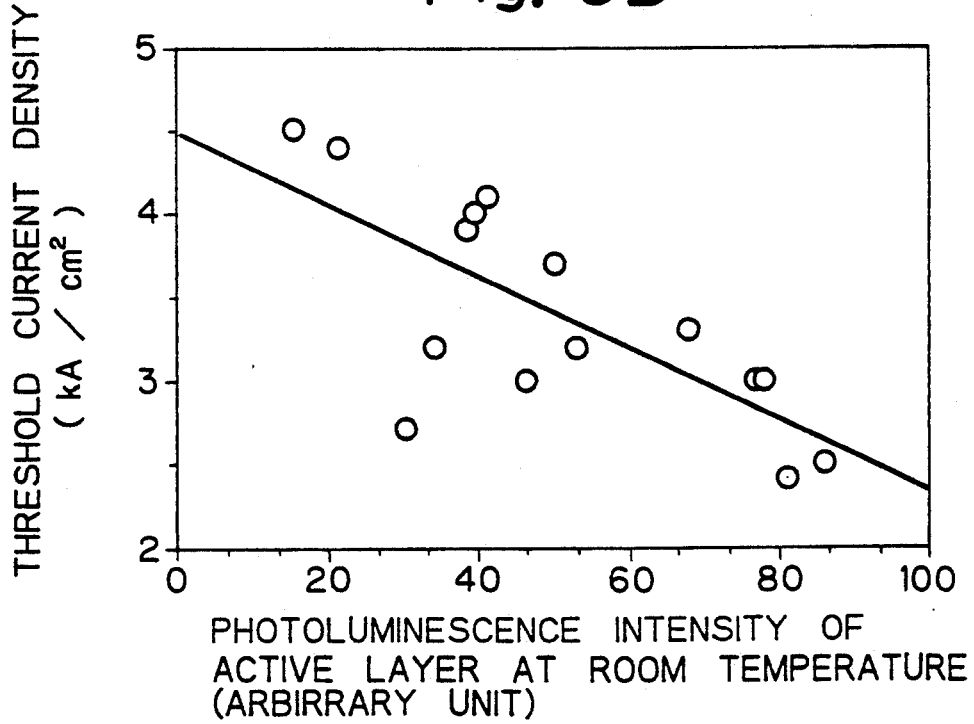

As can be seen from FIGS. 5(A) and 5(B), the lasing threshold current density has a stronger correlation with the photoluminescence intensity of the crystalline quality evaluating layer than with that of the active layer, over a wide range of photoluminescence intensity values varied by the crystal growth conditions and the diffraction grating heights.

The provision of a crystalline quality evaluation layer according to the present invention has another advantage in that the crystalline quality can be compared between samples having different active layer structures by providing the samples with crystalline quality evaluating layers of the same structure, whereas it is meaningless to compare the photoluminescence intensities of the active layers of different structures.

It can be reasonably understood by a person skilled in the art that the present invention is not necessarily limited to the distributed feedback laser (DFB-LD) but is also advantageously applicable in other optical semiconductor devices having a diffraction grating formed therein, such as a distributed Brag reflection laser (DBR-LD), a light waveguide, etc.

As hereinabove described, the present invention provides an optical semiconductor device and a process of producing same ensuring good device performance when a diffraction grating is formed by dry etching and component crystal layers are formed by an MOCVD process.

I claim:

1. A process of producing an optical semiconductor device, comprising the steps of:
   (1) processing a surface of a semiconductor wafer to form thereon a diffraction grating in the form of a periodic corrugation for selectively transmitting a light having a specific wavelength;
   (2) forming on the diffraction grating a guide layer, an active layer and a clad layer in that order;
   (3) forming on the clad layer a double heterostructure composed of lower and upper layers, the upper layer having a bandgap greater than that of the active layer;
   (4) measuring the photoluminescence intensity of the lower layer of the double heterostructure; and
   (5) determining whether or not the process is terminated at the preceding step (4) by using the measured value of the photoluminescence intensity as a discriminative value.

2. A process according to claim 1, wherein said semiconductor wafer is an InP semiconductor wafer; said active layer is composed of InGaAs, InGaAsP or AlInGaAs; said clad layer is composed of InP, AlInAs, or AlInGaAs; said lower layer is composed of InGaAs or InGaAsP; and said upper layer is composed of InGaAsP or InP.

3. A process according to claim 1, wherein said optical semiconductor device has a mesa structure comprising said guide layer, said active layer and clad layer; the mesa structure being embedded in a surrounding semiconductor.

4. A process according to claim 1, comprising the steps of:
   (A) preparing a plurality of reference samples having diffraction gratings with different corrugation heights, respectively, by performing the same processing as that of said step (1) to form a plurality of diffraction gratings with different corrugation heights on surfaces of a plurality of semiconductor wafers or on a plurality of surface regions of a single semiconductor wafer, respectively, and thereafter, performing the same operations as those of said steps (2) and (3) to form a plurality of said double heterostructures;
   (B) measuring the photoluminescence intensity of the lower layers of the double heterostructures of the reference samples;
   (C) determining two levels of reference values which the photoluminescence intensity takes in accordance with the corrugation heights of the diffraction gratings, based on an interrelationship between the measured values of the photoluminescence intensity and the corresponding corrugation heights of the diffraction gratings; and (D) determining, in said step (4), that the subsequent steps are executed when said discriminative value corresponds to a higher level of the reference value and is not executed when said discriminative value does not correspond to the higher level of the reference value.

5. A process according to claim 1, comprising the steps of:

(A) preparing a plurality of reference samples having diffraction gratings with different corrugation heights, respectively, by performing the same processing as that of said step (1) to form a plurality of diffraction gratings with different corrugation heights on surfaces of a plurality of semiconductor wafers or on a plurality of surface regions of a single semiconductor wafer, respectively, and thereafter, performing the same operations as those of said steps (2) and (3) to form a plurality of said double heterostructures;

(B) measuring the photoluminescence intensity of the lower layers of the double heterostructures of the reference samples;

(C) determining two ranges of the corrugation heights in which the photoluminescence intensity takes higher and lower level of values, respectively, based on an interrelationship between the measured values of the photoluminescence intensity and the corresponding corrugation heights of the diffraction gratings; and (D) forming, in said step (1), a diffraction grating having a corrugation height within the determined range in which the photoluminescence intensity takes the higher level of value.

6. A process according to claim 5, wherein those component layers of said optical semiconductor device having a thickness related to the corrugation height of a diffraction grating of said device are formed with a thickness determined in accordance with corrugation height of the diffraction grating within said determined range.

7. An optical semiconductor device, comprising:

a semiconductor substrate;

a diffraction grating in the form of a periodic corrugation formed by processing a surface of the semiconductor substrate for selectively transmitting a light having a specific wavelength; and a guide layer, an active layer and a clad layer formed on the diffraction grating in that order, said diffraction grating having a corrugation height determined by the following steps (A) to (D);

(A) preparing a plurality of reference samples having diffraction gratings with different corrugation heights, respectively, by (1) processing surfaces of a plurality of semiconductor wafers or a plurality of surface regions of a single semiconductor wafer; (2) forming on the diffraction gratings a guide layer, an active layer and a clad layer in that order; and (3) forming on the clad layer a double heterostructure composed of lower and upper layers, the upper layer having a bandgap greater than that of the active layer;

(B) measuring the photoluminescence intensity of the lower layers of the double heterostructures of the reference samples;

(C) determining two ranges of the corrugation height in which the photoluminescence intensity takes higher and lower levels of values, respectively, based on an interrelationship between the measured values of the photoluminescence intensity and the corresponding corrugation heights of the diffraction gratings; and (D) electing the corrugation height within the determined range in which the photoluminescence intensity takes the higher level of value.

8. An optical semiconductor device according to claim 7, wherein said semiconductor is an InP semiconductor wafer; said active layer is composed of InGaAs, InGaAsP or AlInGaAS; said clad layer is composed of InP, AlInAs, or AlInGaAs; said lower layer is composed of InGaAs or InGaAsP; and said upper layer is composed of InGaAsP or InP.

* * * * *